(12) United States Patent
Chiou et al.

(10) Patent No.: US 7,706,119 B2
(45) Date of Patent: Apr. 27, 2010

(54) ELECTROSTATIC DISCHARGE PROTECTION APPARATUS

(75) Inventors: Yao-Jia Chiou, Taoyuan (TW);
Yao-Ching Tsai, Taoyuan (TW);
Jen-Chen Wu, Taoyuan (TW)

(73) Assignee: Quanta Storage Inc., Taoyuan County (TW)

( * ) Notice: Subject to any disclaimer, the term of this patent is extended or adjusted under 35 U.S.C. 154(b) by 512 days.

(21) Appl. No.: 11/802,437

(22) Filed: May 23, 2007

(65) Prior Publication Data
US 2007/0279830 A1 Dec. 6, 2007

(30) Foreign Application Priority Data
Jun. 5, 2006 (TW) .............................. 95119959 A

(51) Int. Cl.
*H05F 3/02* (2006.01)
(52) U.S. Cl. ..................................... 361/220
(58) Field of Classification Search ................ 361/220, 361/56
See application file for complete search history.

(56) References Cited
U.S. PATENT DOCUMENTS

| | | | | |
|---|---|---|---|---|
| 5,959,827 A | * | 9/1999 | Smith et al. ................. | 361/212 |
| 5,969,901 A | * | 10/1999 | Eckberg et al. ........... | 360/97.01 |
| 6,249,432 B1 | * | 6/2001 | Gamble et al. ......... | 361/679.35 |
| 7,363,638 B2 | * | 4/2008 | Peng ........................... | 720/650 |
| 2004/0212938 A1 | * | 10/2004 | Kao et al. ..................... | 361/56 |

* cited by examiner

*Primary Examiner*—Stephen W Jackson
*Assistant Examiner*—Ann T Hoang
(74) *Attorney, Agent, or Firm*—Bacon & Thomas, PLLC

(57) ABSTRACT

An electrostatic discharge protection apparatus disposed in an optical disk drive includes a spindle motor and a feeding mechanism for driving a pick-up head. The mechanism includes a sled motor for driving the pick-up head. A traverse is disposed in a casing of the optical disk drive for disposing the motor and the mechanism. The electrostatic discharge protection apparatus is an elastic sheet disposed at one end of the spindle motor adjacent to the sled motor and includes a main body and several strips extending from the main body. The main body is connected with a metal fixing plate of the spindle motor. One strip contacts the sled motor, another strip contacts the guide bar, and another obliquely protruding strip penetrates and contacts a base plate and presses against the casing. A big electrostatic discharge sink is formed to buffer the transient impact caused by high electrostatic charges.

12 Claims, 3 Drawing Sheets

ELECTROSTATIC DISCHARGE PROTECTION APPARATUS

This application claims the benefit of Taiwan Patent Application Serial No. 95119959, filed Jun. 5, 2006, the subject matter of which is incorporated herein by reference.

BACKGROUND OF THE INVENTION

1. Field of the Invention

The invention relates in general to an electrostatic discharge protection apparatus, and more particularly to an electrostatic discharge protection apparatus of an optical disk drive for preventing damage to delicate electronic components from electrostatic discharge.

2. Description of the Related Art

Electrostatic charges accumulate on the surface of human body and can be as high as several thousands of voltages. When a user touches an electronic product by hand, electrostatic charges suddenly flow to the electronic product. As a result, IC chips on a circuit board inside the electronic product are damaged by electrostatic discharge (ESD), which causes malfunction of the electronic product.

As shown in FIG. 1, a metal plate 2 is disposed on the back of the panel 3 in a conventional optical disk drive 1 for preventing the damage caused by electrostatic discharge. The metal plate 2 closely surrounds an eject button 4 on a panel 3. The panel 3 is disposed on the front of a tray 5, so that the metal plate 2 contacts the front side of a metal base plate (not shown in FIG. 1) under the tray 5. The metal base plate contacts a spindle motor 6 disposed on the tray 5. A cable 7 providing electricity and signals connects the spindle motor 6 with a main board 8. The main board 8 is disposed on the back of a casing 9 of the optical disk drive 1 and contacts the casing 9. The main board 8 and the casing 9 provide a grounding path for dissipating electrostatic charges. A signal line of the cable 7 is grounded through the main board 8 and the casing 9. When the eject bottom 4 is pushed by a user manually, electrostatic charges from the human body is directed by the metal plate 2 toward the spindle motor 6 through the base plate. Then, electrostatic charges are dissipated to the ground through the signal line 7, the main board 8 and the casing 9. Therefore, electrostatic charges do not flow to electronic components on the tray 5, and the delicate electronic components are not damaged by electrostatic charges.

However, the signal line of the cable 7 is a flexible printed circuit board (PCB) cable, and the diameter of the signal line is limited. Generally, electrostatic charges can be dissipated through the signal line, but electrostatic charges with thousands of voltages can not be dissipated through the signal line in time due to the relatively small diameter of the signal line. As a result, electrostatic charges accumulate on the metal plate 2 and the base plate, which increases the possibility of damaging the delicate electronic components by electrostatic charges. Moreover, for reducing the cost and weight of the optical disk drive, not only is the tray 5 integrally formed by plastic, but also a frame of a traverse 10 disposed on the tray 5 is formed integrally by plastic. Therefore, the metal components on the tray 5 are not electrically connected with each other, and electrostatic charge accumulation can not be dissipated. Especially when the tray 5 is ejected from the optical disk drive, an object with electrostatic charges may also contact areas other than the eject bottom 4. Thus, the possibility of the delicate electronic components being damaged by electrostatic charges is increased enormously. Therefore, there are still issues regarding electrostatic discharge protection of optical disk drives that need to be solved.

SUMMARY OF THE INVENTION

One object of the present invention is to provide an electrostatic discharge protection apparatus. By electrically connecting metal components inside an optical disk drive for dissipating electrostatic charges, the effectiveness of the electrostatic discharge protection is improved.

Another object of the present invention is to provide an electrostatic discharge protection apparatus. A metal elastic sheet is used for forming multiple ground paths directly. The dissipation of electrostatic charges is quickened, thus improving the electrostatic discharge protection.

To achieve the above objects of the invention, an electrostatic discharge protection apparatus of the present invention is disposed in an optical disk drive including a spindle motor and a feeding mechanism for driving a pick-up head. The feeding mechanism includes a sled motor for driving the pick-up head to slide along a guide bar. The optical disk drive also includes a traverse disposed inside a casing for disposing the spindle motor and the feeding mechanism. The electrostatic discharge protection apparatus is an elastic sheet disposed at one end of the spindle motor adjacent to the sled motor. The electrostatic discharge protection apparatus includes a main body and several strips extending from the main body. The main body is connected with a metal fixing plate of the spindle motor. One strip contacts the sled motor, and another strip contacts the guide bar. An obliquely protruding strip penetrates and contacts a base plate and then presses against the casing. A large electrostatic discharge sink is formed to absorb and disperse the transient impact caused by high electrostatic charges effectively.

The invention will become apparent from the following detailed description of the preferred but non-limiting embodiments. The following description is made with reference to the accompanying drawings.

DETAILED DESCRIPTION OF THE INVENTION

The preferred embodiments according to the present invention are described as follow with reference to the accompanying drawings for illustrating the present invention.

Figure 1:
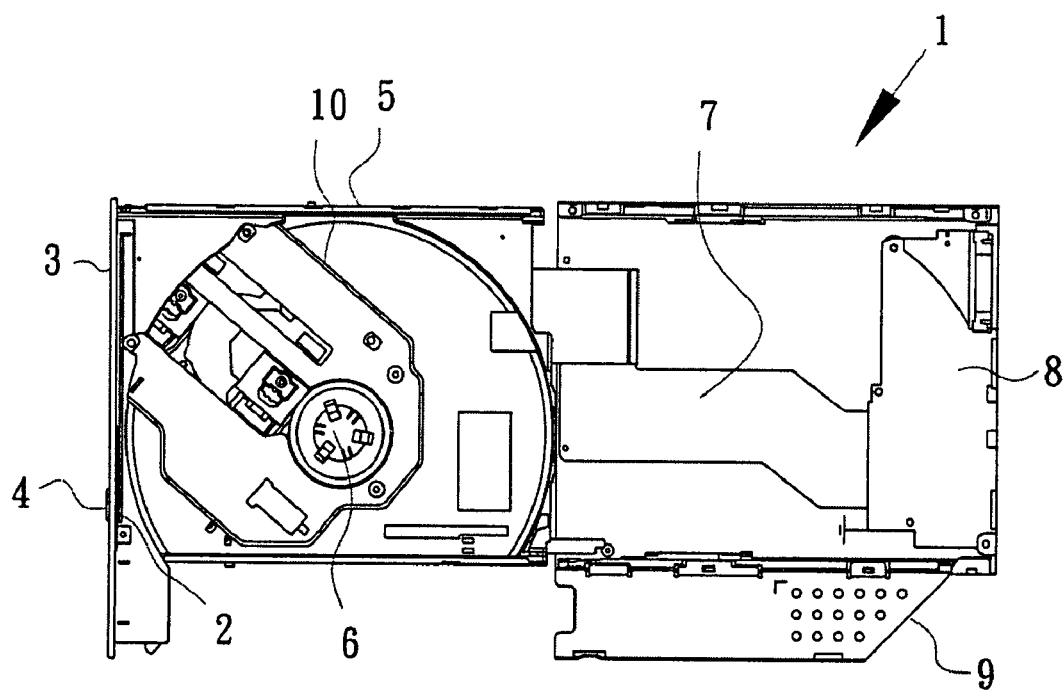
FIG. 1 (Prior Art) is a top view of a conventional optical disk drive.
Figure 2:
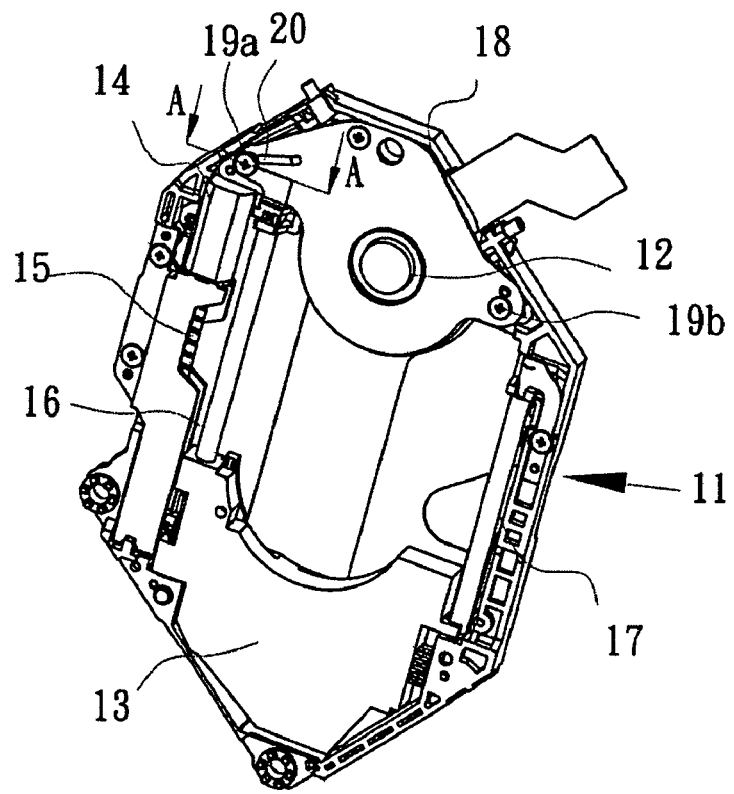
FIG. 2 is a perspective view of a traverse which an electrostatic discharge protection apparatus is applied to according to a preferred embodiment of the present invention.

Please refer to FIG. 2, a traverse that an electrostatic discharge protection apparatus is applied to according to a preferred embodiment of the present invention is shown. The traverse 11, which is a plastic frame for example, includes a spindle motor 12, a pick-up head 13, a sled motor 14, a guiding screw 15, a main guide bar 16 and a secondary guide bar 17. A metal fixing plate 18 supporting the spindle motor 12 extends from one end of the spindle motor 12. The fixing plate 18 is fixed at one end of the traverse 11 by two screws 19a and 19b placing on two sides of the fixing plate 18. In a feeding mechanism for driving the pick-up head 13, the main guide bar 16 and the secondary guide bar 16 are disposed parallel to a radial direction of the spindle motor 12 toward another end of the traverse 11. The sled motor 14 is disposed on one side of the fixing plate 18 and parallel to the main guide bar 16. The guiding screw 15 is disposed by the side of the main guide bar 16 and parallel to the main guide bar 16. One end of the guiding screw 15 is connected with the sled motor 14. One end of the pick-up head 13 is engaged with the guiding screw 15. The main guide bar 16 and the secondary guide bar 17 respectively pierce through two sides of the pick-up head 13, such that the pick-up head 13 is able to slide on the main guide bar 16 and the secondary guide bar 17. The method of reading or writing a disk (the disk is not shown in the drawings) mainly includes the following steps. First, The spindle motor 12 rotates the disk. Then, the sled motor 14 rotates the guiding screw 15 for driving the engaged pick-up head 14, such that the pick-up head 13 slides along the main guide bar 16 and the secondary guide bar 17 and moves back and forth in the radial direction of the disk.

Figure 3:
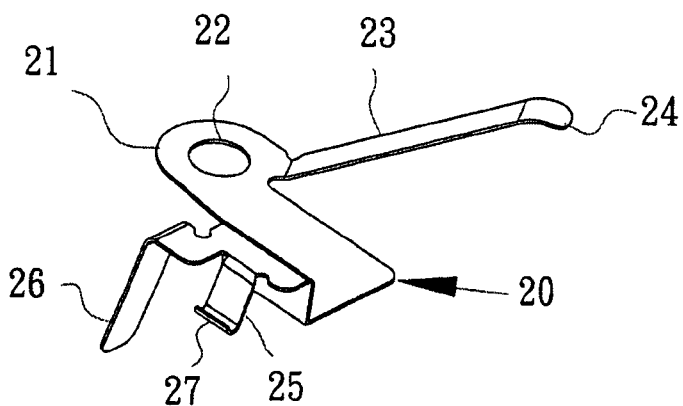
FIG. 3 is a perspective view of the electrostatic discharge protection apparatus according to the preferred embodiment of the present invention.

The electrostatic discharge protection apparatus 20 of the present embodiment is disposed at one end of the fixing plate 18, and a screw 19a fixes the electrostatic discharge protection apparatus 20 along with the fixing plate 18 onto the traverse 11. Please refer to FIG. 3, a perspective view of the electrostatic discharge protection apparatus 20 is shown. The electrostatic discharge protection apparatus 20 is an elastic sheet, and includes a main body 21 that is formed along the surface of the fixing plate 18. A positioning hole 22 is formed in the main body 21. An inclined first strip 23 protrudes from one end of the main body 21, and a smoothly curved top part 24 is formed at the end of the first strip 23. A second strip 25 and a third strip 26 with different length and height extend from another protruded end of the main body 21. The extending directions of the second strip 25 and the third strip 26 are opposite to that of the first strip 23. The third strip 26 is longer than the second strip 25. A curved press part 27 is formed at the end of the second strip 25.

Figure 4:
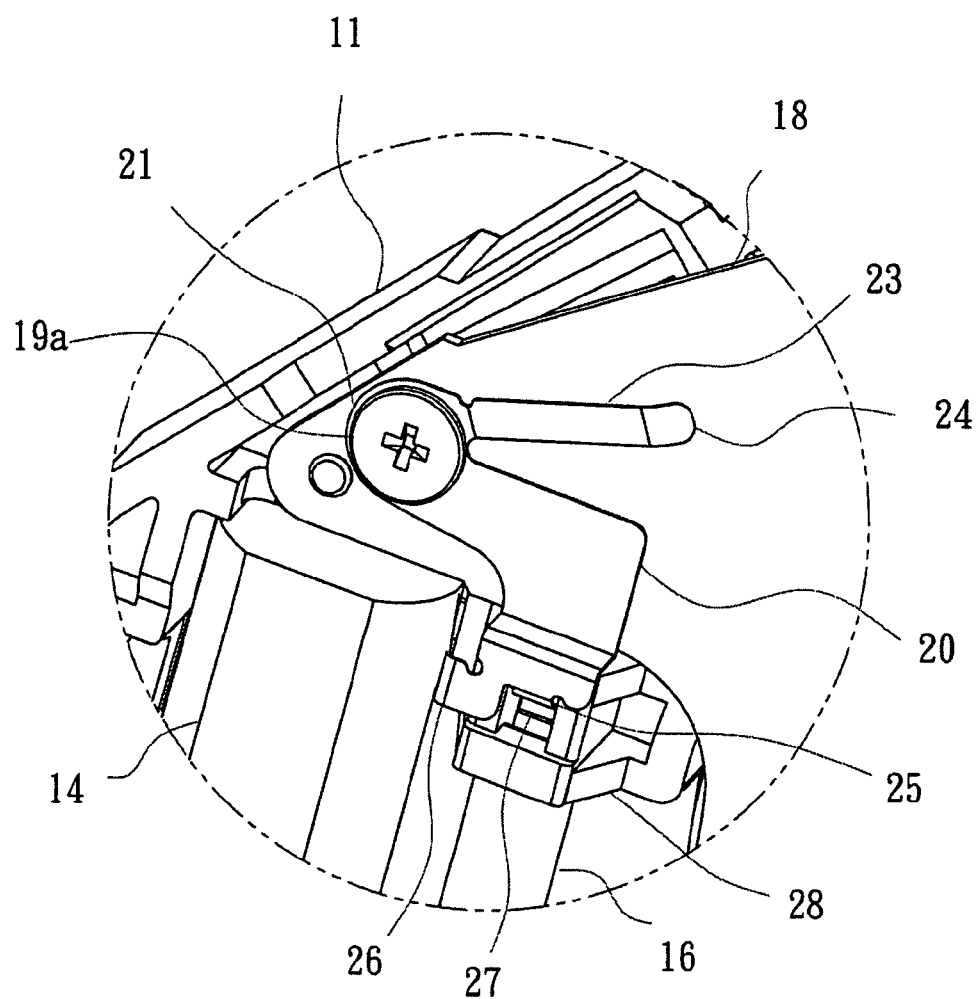
FIG. 4 is an enlarged view of part of the electrostatic discharge protection apparatus fixed on the traverse according to the preferred embodiment of the present invention.

Please refer to FIG. 4, an enlarged view of part of the electrostatic discharge protection apparatus 20 fixed on the traverse 11 is shown. The electrostatic discharge protection apparatus 20 is disposed at one end of the fixing plate 18 adjacent to sled motor 14 and the main guide bar 16. The screw 19a fixes the electrostatic discharge protection apparatus 20 along with the fixing plate 18 on the traverse 11 through the positioning hole 22. The main body 21 of the electrostatic discharge protection apparatus 20 is disposed closely to the surface of the fixing plate 18. One end of the electrostatic discharge protection apparatus 20 extends toward the sled motor 14 and the main guide bar 16. The second strip 25 is conformal to the shape of a fixing frame 28 of the main guide bar 16, and the press part 27 of the second strip 25 presses against one end of the main guide bar 16. The third strip 26 adjacent to the second strip 25 tightly presses against a side of the sled motor 14.

Figure 5:
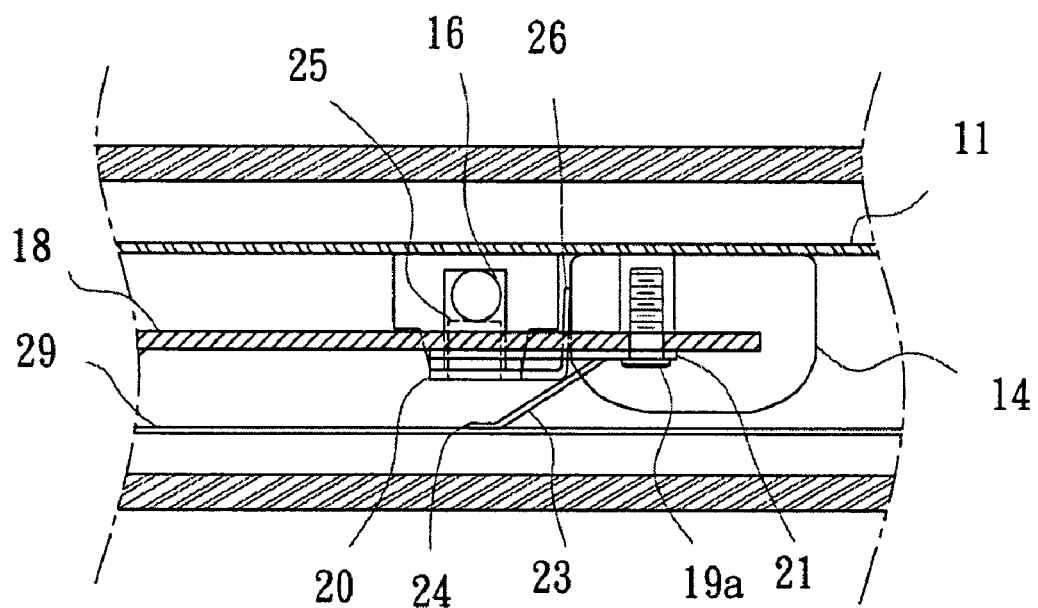
FIG. 5 is an enlarged cross-sectional view of part of the electrostatic discharge protection apparatus fixed on the traverse according to the preferred embodiment of the present invention.

Please refer to FIG. 5, a cross-sectional view of the electrostatic discharge protection apparatus 20 of the present embodiment fixed on the traverse 11 along a cross-sectional line A-A in FIG. 2 is shown. The first strip 24 of the main body 21 is obliquely protruded from the surface of the fixing board 18 toward the base plate 29. The top part 24 of the first strip 23 pressed against the base plate 29 of the traverse 11. Therefore, the electrostatic discharge protection apparatus 20 of the present embodiment electrically connects the fixing plate 18 of the spindle motor 12, the base plate 29, the main guide bar 16 and the sled motor 14 through the main body 21, the first strip 23, the second strip 25 and the third strip 26. The larger metal components that are not affected by electrostatic charges form a large temporary electrostatic discharge sink for absorbing and dispersing the transient impact of high electrostatic charges. The electrostatic discharge protection apparatus 20 then has sufficient time to dissipate electrostatic charges, so the effectiveness of electrostatic discharge protection is improved. Especially in the case of a plastic traverse, the electronic components disposed on the traverse are electrically isolated from each other, the effectiveness of the electrostatic discharge protection is further improved by forming a large electrostatic discharge sink through the electrostatic discharge protection apparatus 20.

Figure 6:
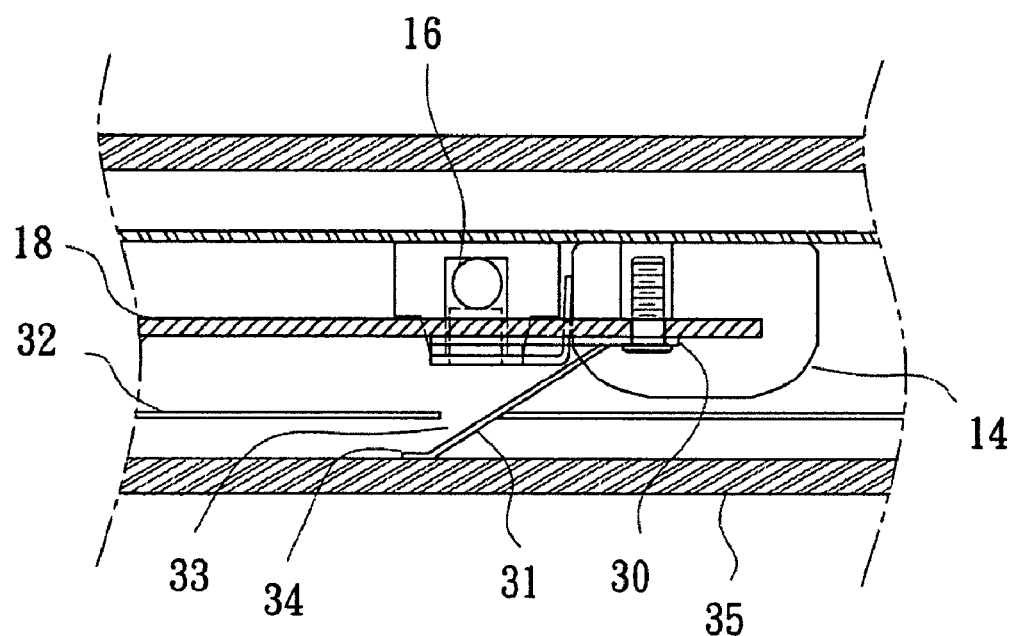
FIG. 6 is an enlarged cross-sectional view of part of an electrostatic discharge protection apparatus fixed on the traverse according to another embodiment of the present invention.

FIG. 6 illustrates an electrostatic discharge protection apparatus 30 according to another embodiment of the present invention. The basic concepts of this embodiment are substantially the same as the pre-described embodiment, and same components use the same reference numbers to simplify the description herein. The main difference in this embodiment is that the first strip 31 is long enough to penetrate the base plate 32 via a through hole 33. The first strip 31 not only contacts the base plate 32, but also presses against the casing 35 of the optical disk drive by the top part 34. Therefore, through the electrostatic discharge protection apparatus 30 of the present embodiment, the fixing plate 18 of the spindle motor 12, the base plate 32, the main guide bar 16, the sled motor 14 and the casing 35 form an even larger temporary electrostatic discharge sink, which absorbs and disperses the transient impact of high electrostatic charges more effectively. Furthermore, the first strip 31 presses against the casing 35 of the optical disk drive directly to form a ground path, so that electrostatic charges applied on the components are able to be dissipated through the electrostatic discharge protection apparatus 30 and the casing 35 immediately. Multiple ground paths are provided to increase the efficiency of dissipating electrostatic charges. Therefore, the reliability of the electrostatic discharge protection is proved. Although the embodiments of the present invention are exemplified by a tray-loading optical disk drive, the invention is not limited thereto. For example, the electrostatic discharge protection apparatus of the present invention can be applied to a slot-loading optical disk drive.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge protection apparatus disposed in an optical disk drive, the optical disk drive comprising a spindle motor and a feeding mechanism for driving a pick-up head, the electrostatic discharge protection apparatus comprising:
   a main body connected with the spindle motor; and
   at least a strip extending from the main body and contacting the feeding mechanism.

2. The electrostatic discharge protection apparatus according to claim 1, wherein a metal fixing plate extends from one end of the spindle motor, the main body connected with the fixing plate.

3. The electrostatic discharge protection apparatus according to claim 2, wherein a positioning hole is formed in the main body for connecting with the fixing plate.

4. The electrostatic discharge protection apparatus according to claim 1, wherein the feeding mechanism further comprises a sled motor for driving the pick-up head to slide along a guide bar, the electrostatic discharge protection apparatus further comprising a plurality of strips extending from the main body, one strip contacting the sled motor and another strip contacting the guide bar.

5. The electrostatic discharge protection apparatus according to claim 4, wherein the apparatus is disposed at one end of the spindle motor adjacent to the sled motor.

6. The electrostatic discharge protection apparatus according to claim 1, wherein the apparatus further comprises another strip obliquely extending and protruding from the main body.

7. The electrostatic discharge protection apparatus according to claim 6, wherein the optical disk drive further comprises a traverse for disposing the spindle motor and the feeding mechanism, the obliquely protruding strip pressing against a base plate under the traverse.

8. The electrostatic discharge protection apparatus according to claim 6, wherein the optical disk drive further comprises a casing, the obliquely protruding strip pressing against the casing.

9. The electrostatic discharge protection apparatus according to claim 8, wherein the optical disk drive further comprises a traverse inside the casing for disposing the spindle motor and the feeding mechanism, the obliquely protruding strip penetrating the base plate and pressing against the casing.

10. The electrostatic discharge protection apparatus according to claim 9, wherein the obliquely protruding strip penetrates and contacts the base plate.

11. The electrostatic discharge protection apparatus according to claim 10, wherein a through hole is formed in the base plate for the obliquely protruding strip to penetrate the base plate.

12. The electrostatic discharge protection apparatus according to claim 1, wherein the apparatus is an elastic sheet.

* * * * *